United States Patent
Shimizu

(10) Patent No.: US 6,901,017 B2
(45) Date of Patent: May 31, 2005

(54) SEMICONDUCTOR MEMORY HAVING HIERARCHICAL BIT LINE STRUCTURE

(75) Inventor: Hiroshi Shimizu, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/629,809

(22) Filed: Jul. 30, 2003

(65) Prior Publication Data
US 2004/0037139 A1 Feb. 26, 2004

(30) Foreign Application Priority Data
Aug. 20, 2002 (JP) .................................... 2002-239629

(51) Int. Cl.⁷ .............................................. G11C 7/00
(52) U.S. Cl. ................................... 365/203; 365/154
(58) Field of Search ............................. 365/203, 205, 365/154, 156, 230.03

(56) References Cited

U.S. PATENT DOCUMENTS

| 5,323,349 | A | | 6/1994 | Hamade et al. | |
|---|---|---|---|---|---|
| 5,701,269 | A | | 12/1997 | Fujii | |
| 5,828,594 | A | | 10/1998 | Fujii | |
| 6,178,134 | B1 | * | 1/2001 | Evans et al. | 365/230.03 |
| 6,650,580 | B1 | * | 11/2003 | Braceras | 365/201 |
| 6,711,076 | B2 | * | 3/2004 | Braceras | 365/201 |

FOREIGN PATENT DOCUMENTS

| JP | Hei 5-128859 | 5/1993 |
|---|---|---|
| JP | Hei 9-246482 | 9/1997 |
| JP | 2001-67876 | 3/2001 |

* cited by examiner

Primary Examiner—Gene N. Auduong
(74) Attorney, Agent, or Firm—Arent Fox PLLC

(57) ABSTRACT

A first amplifier amplifies voltage of a first local bit line connected to static memory cells. Precharging circuits for precharging a first global bit line connected to an output of the first amplifier supply a precharging current through both ends of the first global bit line, respectively. Since the precharging current flows through the first global bit line in both directions, electromigration criteria can be made looser than in cases where the current flows in one direction. This makes it possible to avoid a defect which occurs due to electromigration of the first global bit line. Since the first global bit line can be reduced in wiring width, it is possible to minimize the layout area. As a result, the semiconductor memory can be reduced in chip size with a reduction in chip cost.

9 Claims, 5 Drawing Sheets

SEMICONDUCTOR MEMORY HAVING HIERARCHICAL BIT LINE STRUCTURE

CROSS-REFERENCE TO RELATED APPLICATIONS

This application is based upon and claims the benefit of priority from the prior Japanese Patent Application No. 2002-239629, filed on Aug. 20, 2002, the entire contents of which are incorporated herein by reference.

BACKGROUND OF THE INVENTION

1. Field of the Invention

The present invention relates to a semiconductor memory having static memory cells. In particular, the present invention relates to a semiconductor memory having bit lines of hierarchical structure.

2. Description of the Related Art

Semiconductor memories are growing in memory capacity as the transistor structure gets finer. Meanwhile, with finer transistor structures, logic LSIs such as a microcomputer are improving in operating frequency. For the sake of improved operating frequencies, shorter access time is thus required of the semiconductor memories. DRAMs and such semiconductor memories have bit lines of hierarchical structure in view of reduced access time. To meet the need for a further speedup, hierarchization has been recently contemplated of the wiring structure of bit lines even in semiconductor memories having static memory cells (hereinafter, referred to as SRAMs).

Japanese Unexamined Patent Application Publication No. Hei 9-246482 discloses a circuit technology and a layout technology for a hierarchical bit line structure of a DRAM.

Japanese Unexamined Patent Application Publication No. Hei 5-128859 discloses a hierarchical bit line structure of a DRAM in which bit lines for read and bit lines for write are formed independently of each other. The global bit lines for read are connected to the drains of transistors. The gates of these transistors are connected to local bit lines. The global bit lines are precharged to a circuit internal step-down voltage which is a power supply voltage VCC stepped down by a load circuit. The system that local bit lines in connection with memory cells are connected to the gates of transistors is typically referred to as direct sense system.

Japanese Unexamined Patent Application Publication No. 2001-67876 discloses a hierarchical bit line structure of a DRAM in which local bit lines and global bit lines are connected to each other through CMOS transmission gates. The global bit lines are precharged to an internal step-down voltage VDL.

By the way, DRAMs store data by retaining charges corresponding to the data into their memory cells. When the memory cells are accessed, the storage charges of the memory cells are shared between bit lines. Sense amplifiers amplify the small voltage variations on the bit lines. Since the slight voltage variations on the bit lines are detected by the sense amplifiers, the DRAMs are susceptible to noise in accessing the memory cells. The influence of power supply noise and the like on the bit lines is thus reduced by, for example, using an internal step-down voltage lower than the power supply voltage as the precharging voltage of the global bit lines.

SRAM memory cells are made of flip-flops. The flip-flops store data written to the memory cells (logic "1" or logic "0") in the form of, for example, a power supply voltage or a ground voltage. When the memory cells are accessed, the flip-flops output the stored power supply voltage or ground voltage to bit lines directly. Consequently, SRAMs are less susceptible to power supply noise than DRAMs are, and will not malfunction even if the power supply voltage is used as the precharging voltage.

In the hierarchical bit line structure (direct sense system) disclosed in Japanese Unexamined Patent Application Publication No. Hei 5-128859, the global bit lines undergo currents that flow in one direction alone, or from the load circuit (precharging circuit) to the memory cells. Electromigration criteria on the wiring through which currents flow in one direction are stricter that those on wiring through which currents flow in both directions. In other words, the wiring through which currents flow in one direction is more prone to disconnection resulting from electromigration than the wiring through which currents flow in both directions is.

In DRAMS, however, the global bit lines are supplied with the internal step-down voltage. Hence, at ordinary wiring widths, electromigration does not matter. On the other hand, in SRAMs in which the global bit lines are precharged to the power supply voltage, the currents flowing through the global bit lines are higher than in DRAMs. Consequently, when an SRAM adopts a hierarchical bit line structure of direct sense system, i.e., when an SRAM is provided with global bit lines through which currents flow in one direction, the global bit lines must be given a wiring width greater than heretofore so as to avoid disconnection resulting from electromigration.

In general, SRAMs have date terminals of 8 bits or broader bit widths such as 16, 32, 64, 72, 144, and 288 bits. The number of global bit lines in a chip increases depending on the number of bits of the data terminals. Consequently, there is the problem that broadening the global bit lines in wiring width can cause an increase in chip size as well as in chip cost.

SUMMARY OF THE INVENTION

It is an object of the present invention to avoid a defect which occurs due to electromigration of bit lines connected to static memory cells.

Another object of the present invention is to reduce the chip size of a semiconductor memory having static memory cells.

According to one of the aspects of the semiconductor memory of the present invention, memory blocks each have a plurality of static memory cells, a first local bit line, and a first amplifier. The first local bit line is connected to the static memory cells. The first amplifier amplifies voltage of the first local bit line. A first global bit line is connected to an output of the first amplifier of each of the memory blocks and transfers read data amplified by the first amplifier. Precharging circuits for precharging the first global bit line to a first power supply voltage are connected to both ends of the first global bit line, respectively.

A precharging current is supplied to the first global bit line through the precharging circuits on both ends, respectively. The precharging current flows through the first global bit line in both directions. The first global bit line can thus be designed according to electromigration criteria for situations where the current flows in both directions. In other words, since the first global bit line can be designed according to the standards looser than the electromigration criteria for situations where the current flows in one direction (where a precharging circuit is connected to one end of the first global bit line), it is possible to avoid a defect which occurs due to the electromigration of the first global bit line. Moreover, since the design can be made under the loose criteria as described above, it is possible to reduce the wiring width of the first global bit line and minimize the layout area. As a result, the semiconductor memory can be reduced in chip size with a reduction in chip cost.

According to another aspect of the semiconductor memory of the present invention, the precharging circuits precharge the first global bit line to an external power supply voltage supplied from the exterior of the semiconductor memory. Since a circuit for generating the first power supply voltage (precharging voltage) need not be formed in the semiconductor memory, the semiconductor memory can be reduced in chip size.

According to another aspect of the semiconductor memory of the present invention, the precharging circuits each have a first transistor. The gate of the first transistor receives a control signal being activated in a precharge operation. The drain of the first transistor is connected to the first global bit line, and the source of the same is connected to a first power supply line for supplying the first power supply voltage. The precharging circuits connect the first global bit line to the first power supply line in accordance with the control signal which is activated in a precharge operation. Forming the precharging circuits by a transistor allows layout area of the precharging circuits to be minimized with a reduction in chip size of the semiconductor memory.

According to another aspect of the semiconductor memory of the present invention, the first amplifier has a second transistor. The gate of the second transistor receives the voltage of the first local bit line. The drain of the second transistor is connected to the first global bit line, and the source of the same is connected to a second power supply line for supplying a second power supply voltage. The first amplifier amplifies the voltage of the first local bit line and connect the amplified voltage to the first global bit line. That is, the first amplifier forms a read circuit of direct sense system.

Consequently, in the semiconductor memory which has the static memory cells and adopts a hierarchical bit line structure of direct sense system, it is possible to avoid a defect which occurs due to the electromigration of the first global bit line. In addition, the first global bit line can be minimized in layout area. As a result, the semiconductor memory can be reduced in chip size with a reduction in chip cost.

For example, the first global bit line is charged (precharged) and the voltage of which is changed to the first power supply voltage through the first transistor. Then, the first global bit line is discharged and the voltage of which is changed to the second power supply voltage through the second transistor in accordance with the values stored in the static memory cells. The first transistor and the second transistor can be inversed in polarity so that the voltage of the first global bit line can be surely changed to the first power supply voltage and the second power supply voltage, thereby allowing data stored in the static memory cells to be read at high speed. Moreover, by increasing the voltage difference between the precharging voltage and the read voltage, incorrect data read can be prevented.

According to another aspect of the semiconductor memory of the present invention, a second local bit line connected to the static memory cells transfers data complementary to the data transferred by the first local bit line. That is, the first and second local bit lines constitute complementary bit lines. The static memory cells are connected to both the first and second local bit lines. Data can thus be read by connecting the first global bit line to either one of the complementary local bit lines. Since the first global bit line need not be formed in a pair, the semiconductor memory can be prevented from increasing in chip size.

According to another aspect of the semiconductor memory of the present invention, the first global bit line is laid along the direction in which the memory blocks are arranged. This makes it possible to minimize the wiring length of the first global bit line with a reduction in wiring load. As a result, in precharge operations and read operations, the voltage of the first global bit line can be changed in a shorter time with a reduction in access time of the semiconductor memory. In addition, the layout design is facilitated.

According to another aspect of the semiconductor memory of the present invention, a second global bit line transfers write data to the static memory cells. A second amplifier amplifies voltage of the second global bit line and outputs the amplified data to the first local bit line. Consequently, even in the semiconductor memory where the global bit line for read operation and the global bit line for write operation are formed separately, it is possible to avoid a defect which occurs due to the electromigration of the first global bit line. In addition, the first global bit line can be minimized in layout area.

According to another aspect of the semiconductor memory of the present invention, the first global bit line is laid in parallel with the first local bit line. This makes it possible to minimize the wiring length of the first global bit line with a reduction in wiring load. As a result, in precharge operations and read operations, the voltage of the first global bit line can be changed in a shorter time with a reduction in access time of the semiconductor memory. In addition, the layout design is facilitated.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
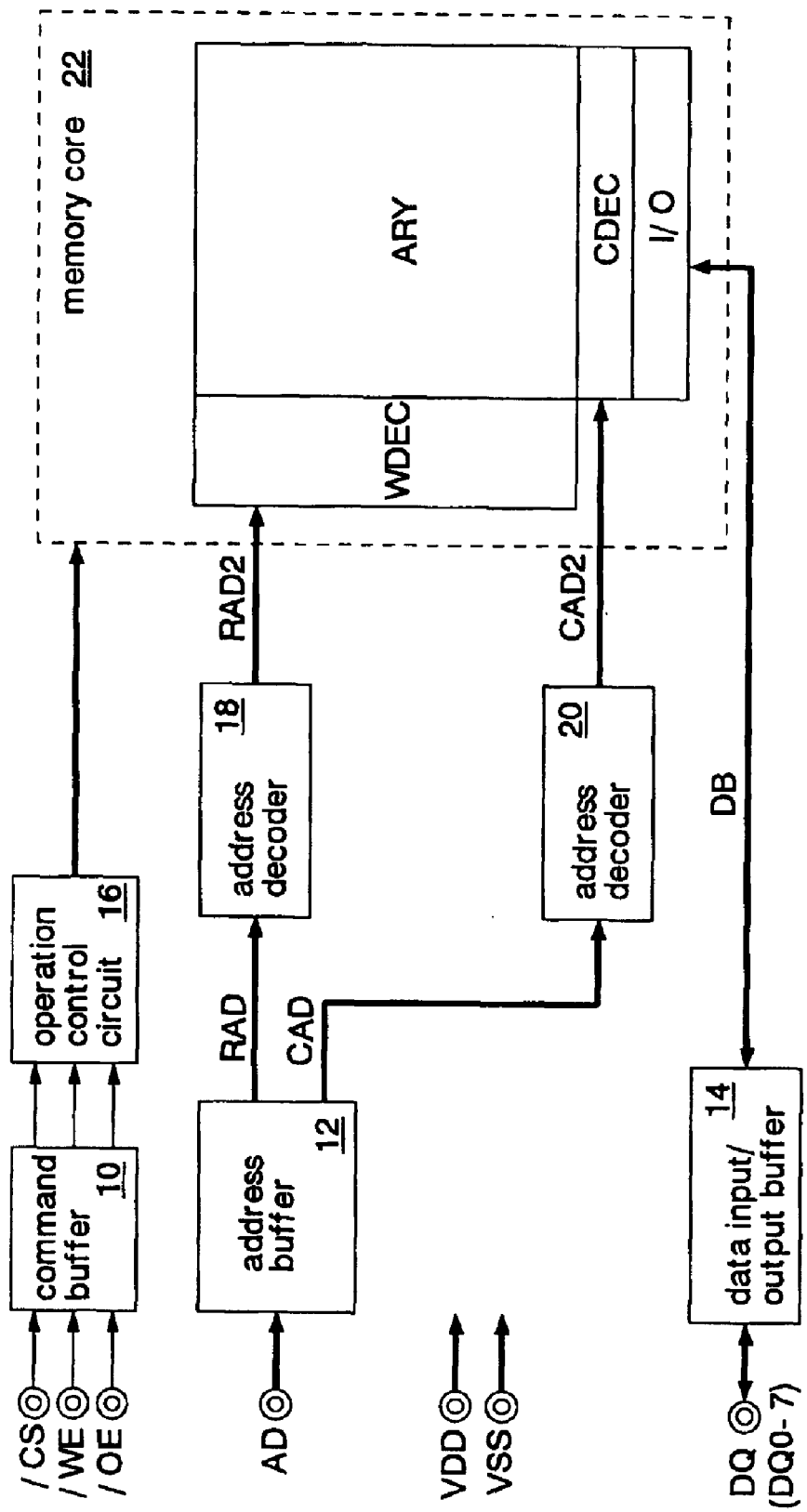
FIG. 1 is a block diagram showing a first embodiment of the semiconductor memory of the present invention.

Hereinafter, embodiments of the present invention will be described with reference to the drawings. In the drawings, each thick line represents a signal line that consists of a plurality of lines. Signals with a leading "/" are of negative logic. Double circles in the drawings represent external terminals. In the following description, signal names may be abbreviated like a "/CS signal" for a "chip select signal".

FIG. 1 shows a first embodiment of the semiconductor memory of the present invention. This semiconductor memory is formed as an SRAM on a silicon substrate by using CMOS processes.

The SRAM has a command buffer 10, an address buffer 12, a data input/output buffer 14, an operation control circuit 16, address decoders 18 and 20, and a memory core 22.

The command buffer 10 receives command signals (a chip select signal /CS, a write enable signal /WE, and an output enable signal /OE) from exterior. The address buffer 12 receives an address signal AD through address terminals, and outputs the received signal as a row address signal RAD (upper address) and a column address signal CAD (lower address).

The data input/output buffer 14, in a read operation, receives read data through a data bus DB and outputs the received data to data terminals DQ. In a write operation, the data input/output buffer 14 receives write data through the data terminals DQ and outputs the received data to the data bus DB. Eight data terminals DQ (DQ0–7) are formed in this example.

The operation control circuit 16 decodes the command signals supplied from the command buffer 10, and outputs a control signal for operating the memory core 22. The address decoder 18 decodes the row address signal RAD and outputs the resultant as a decoding signal RAD2. The address decoder 20 decodes the column address signal CAD and outputs the resultant as a decoding signal CAD2.

The memory core 22 has a memory cell array ARY, a word decoder WDEC, a column decoder CDEC, and an input/output control circuit I/O. The word decoder WDEC drives (selects) any one of word lines WL to be described later in accordance with the decoding signal RAD2 from the address decoder 18. The column decoder CDEC connects any of memory cells MC to be described later to the data bus DB in accordance with the decoding signal CAD2 from the address decoder 20. The input/output control circuit I/O operates in accordance with the command signals, outputting a data signal to the memory cell array ARY (write operation) or outputting a data signal to the data input/output buffer 14 (read operation).

Figure 2:
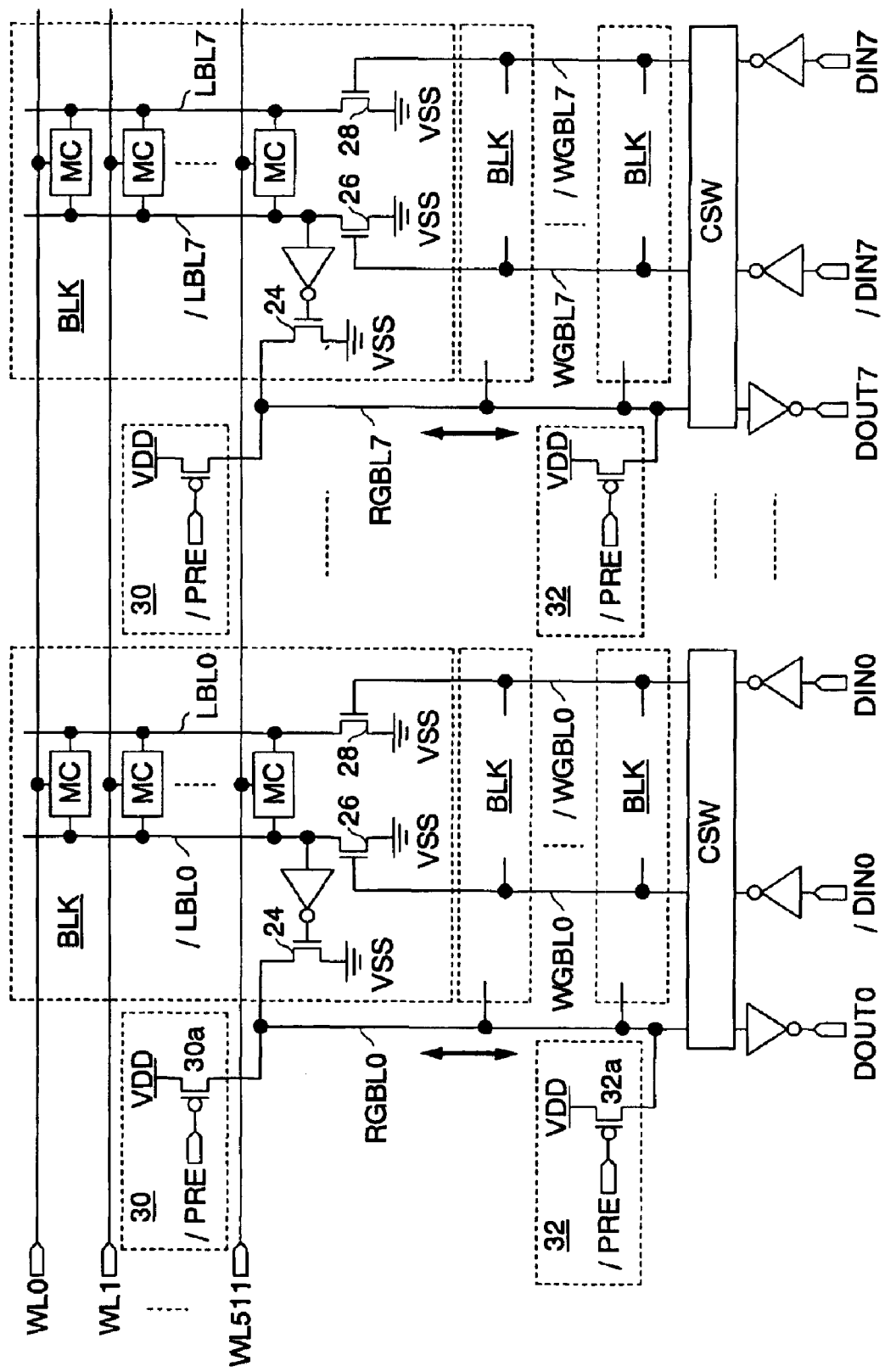
FIG. 2 is a block diagram showing the details of the memory cell array shown in FIG. 1.

FIG. 2 shows the details of the memory cell array ARY shown in FIG. 1.

The memory cell array ARY has a plurality of memory blocks BLK (BLK0–7) which are arranged in a matrix. The memory blocks BLK0–7 correspond to the data terminals DQ0–7, respectively. Each of the memory blocks BLK has a plurality of static type memory cells MC (static memory cells). The structures of the memory blocks BLK0–7 and the control circuits to be connected to these memory cells BLK0–7 are identical. Thus, the following description deals with the memory blocks BLK0 which correspond to the data terminal DQ0.

The memory blocks BLK0 are arranged in a row along the vertical direction in the diagram. The memory blocks BLK1–7 are also arranged in respective rows along the vertical direction in the diagram. In each of the memory blocks BLK0, memory cells MC are connected to complementary local bit lines /LBL0 and LBL0 (/LBL0: first local bit line, LBL0: second local bit line). The local bit lines /LBL0 and LBL0 are made of aluminum, copper, or such material. The memory cells MC are connected to word lines WL (WL0–511), respectively.

The local bit line /LBL0 is connected to the gate of an nMOS transistor 24 (second transistor) through a CMOS inverter. The source of the nMOS transistor 24 is connected to a ground line VSS (second power supply line) to which a ground voltage (second power supply voltage) is supplied. The drain is connected to a global bit line RGBL0 through which read data is transferred. The local bit line /LBL0, the global bit line RGBL0, and the nMOS transistor 24 whose gate is connected to the local bit line /LBL0 and whose drain is connected to the global bit line RGBL0 constitute a hierarchical bit line structure of direct sense amplifier system. The nMOS transistor 24 functions as a sense amplifier (first amplifier) for amplifying the voltage of the local bit line /LBL0.

The local bit lines LBL0 and /LBL0 are connected to the drains of nMOS transistors 26 and 28, respectively. The gates of the nMOS transistors 26 and 28 are connected to global bit lines /WGBL0 and WGBL0, respectively, through which write data is transferred. The sources of the nMOS transistors 26 and 28 are connected to the ground line VSS.

The global bit line RGBL0 (first global bit line) is laid along the direction of arrangement of the memory blocks BLK0. The global bit line RGBL0 is also laid in parallel with the local bit lines LBL0 and /LBL0. The global bit line RGBL0 is made of aluminum, copper, or such material. The memory cells MC are connected to the word lines WL (WL0–511), respectively. Both ends of the global bit line RGBL0, the top and bottom in the diagram, are connected with precharging circuits 30 and 32, respectively. The precharging circuits 30 and 32 have pMOS transistors 30a and 32a (first transistors), respectively. The gates of the pMOS transistors 30a and 32a receive a precharging signal /PRE (control signal). The sources of the pMOS transistors 30a and 32a are connected to an external power supply line VDD (first power supply line) to which an external power supply voltage (first power supply voltage, external power supply voltage) is supplied. The drains are connected to the global bit line RGBL0. The global bit line RGBL0 is connected to a read data bus DOUT0 through a column switch CSW, which is controlled by the column decoder CDEC shown in FIG. 1, and an inverter. The read data bus DOUT0 is connected to the data bus DB through the input/output control circuit I/O shown in FIG. 1.

The global bit lines WGBL0 and /WGBL0 (second global bit lines) are laid along the direction of arrangement of the memory blocks BLK0. The global bit lines WGBL0 and /WGBL0 are made of aluminum, copper, or such material. The global bit lines WGBL0 and /WGBL0 are connected to write data buses /DIN0 and DIN0, respectively, through the column switch CSW and inverters. The write data buses /DIN0 and DIN0 are connected to the data bus DB through the input/output control circuit I/O shown in FIG. 1.

The local bit line /LBL0, the global bit line WGBL0, and the nMOS transistor 26 whose gate is connected to the global bit line WGBL0 and whose drain is connected to the local bit line /LBL0 constitute a hierarchical bit line structure of direct sense amplifier system. Similarly, the local bit line LBL0, the global bit line /WGBL0, and the nMOS transistor 28 whose gate is connected to the global bit line /WGBL0 and whose drain is connected to the local bit line LBL0 constitute a hierarchical bit line structure of direct sense amplifier system. The nMOS transistors 26 and 28 function as sense amplifiers (second amplifiers) for amplifying the voltages of the global bit lines WGBL0 and /WGBL0.

Figure 3:
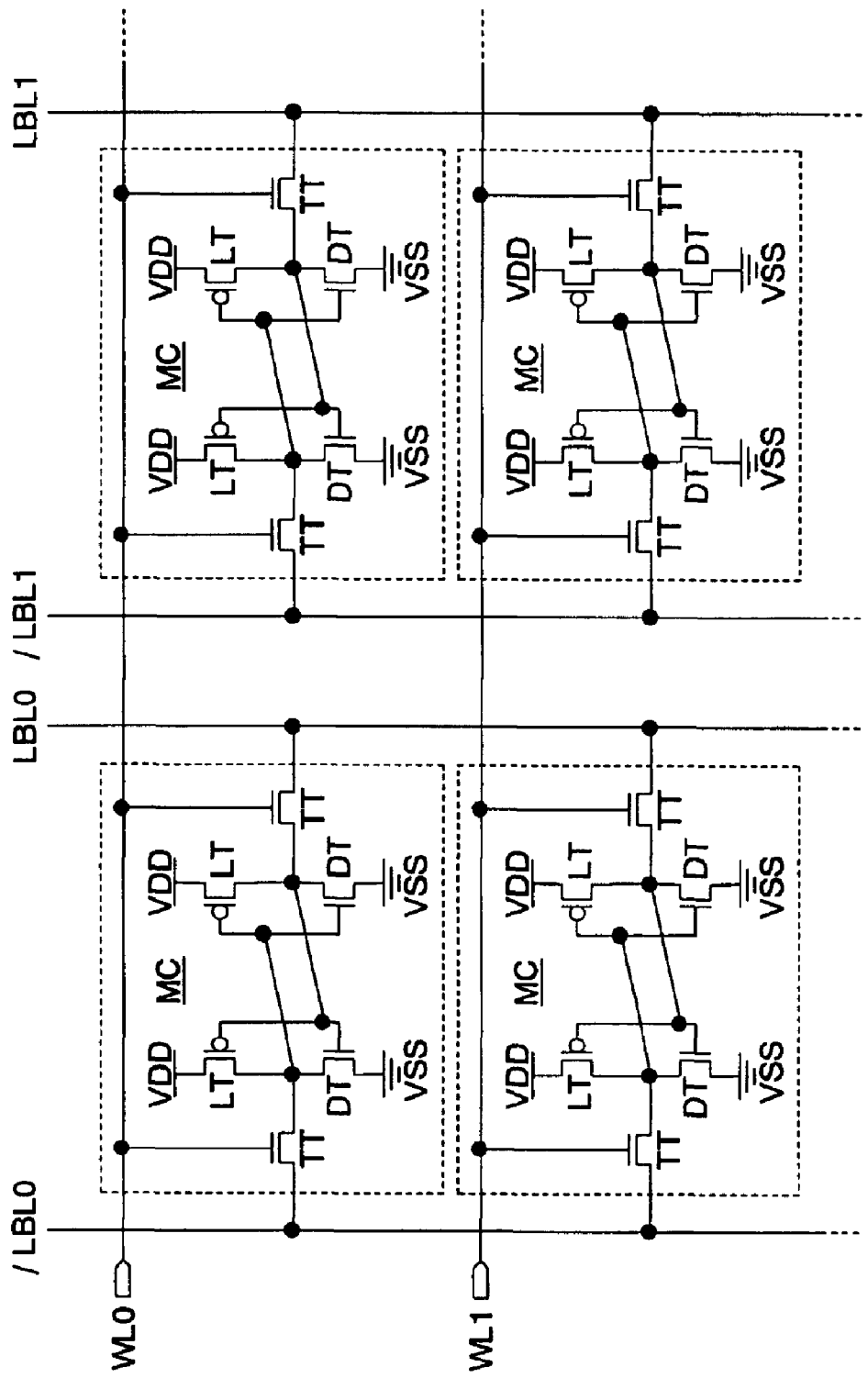
FIG. 3 is a circuit diagram showing the details of the memory cells shown in FIG. 2.

FIG. 3 shows the details of the memory cells MC shown in FIG. 2. The memory cells MC have two transfer transistors TT, two driver transistors DT, and two load transistors LT each. The transfer transistors TT and the driver transistors DT are made of nMOS transistors. The load transistor LT are made of pMOS transistors.

The load transistors LT and the driver transistors DT form two CMOS inverters having inputs and outputs connected to each other. The sources of the load transistors LT are connected to the external power supply line VDD. The sources of the driver transistors DT are connected to the ground line VSS. The transfer transistors TT connect the inputs of the CMOS inverters to the local bit lines LBL and /LBL (/LBL0, 1, . . . , LBL0, 1, . . . ), respectively. The gates of the transfer transistors TT are connected to the word lines WL (WL0, 1, . . . ). That is, the memory cells MC are typical SRAM memory cells of 6-transistor type.

In the SRAM described above, as shown in FIG. 2, the precharging circuits 30 and 32 are connected to both ends of the global bit lines RGBL for read, respectively. Consequently, in read operations where data is read from the memory cells MC and in precharge operations where the power supply voltage VDD is supplied to the global bit lines RGBL, the global bit lines RGBL undergo currents that flow in both directions as shown by thick arrows in the diagram. The electromigration criteria on the global bit lines RGBL are for situations where the currents flow in both directions. Since the electromigration criteria are looser than when the currents flow in one direction alone, the amounts of currents to flow through the global bit lines RGBL can be made relatively greater. Specifically, the maximum current can be made several times that for the case where the currents flow in one direction alone. Higher currents can shorten the period of the precharge operation, thereby reducing the cycle time. When the amounts of currents need not be increased, the global bit lines RGBL can be reduced in wiring width. As a result, the memory cell array ARY can be made smaller in layout area.

Figure 4:
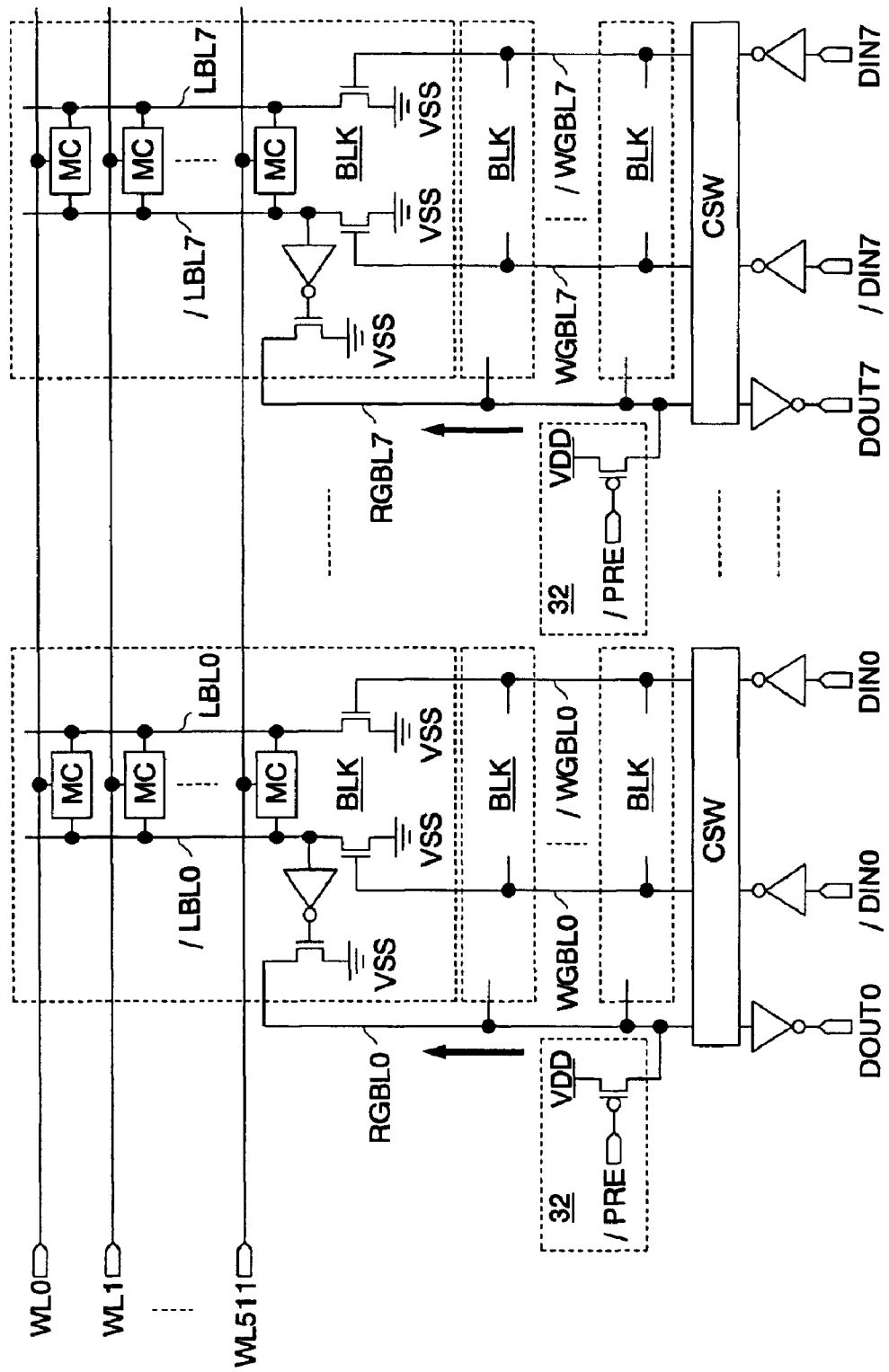
FIG. 4 is a block diagram showing a comparative example to the invention of the first embodiment.

FIG. 4 shows a comparative example to the invention of the first embodiment.

In FIG. 4, the global bit lines RGBL are connected with precharging circuits 32 alone, each at an end closer to the column switch CSW. In this case, during read operations and precharge operations, the global bit lines RGBL undergo currents that always flow in the directions of the thick arrows. The electromigration criteria on the global bit lines RGBL are thus stricter than in the first embodiment (FIG. 2). As a result, in FIG. 4, the global bit lines RGBL must be broadened in wiring width, increasing the layout size of the memory cell array ARY. In such semiconductor memories as an SRAM, the memory cell array ARY occupies most of the chip area. Consequently, an increase in the area of the memory cell array ARY may increase the chip size and raise the chip cost. In other words, according to the first embodiment, it is possible to avoid an increase in chip size even when hierarchical bit line structures of direct sense system are adopted.

As above, in the present embodiment, the precharging circuits 30 and 32 are formed on both ends of the global bit lines RGBL, respectively. Precharging currents can thus flow through the global bit lines RGBL in both directions, loosening the electromigration criteria. In particular, in an SRAM that adopts hierarchical bit line structures of direct sense system, it is possible to avoid a defect occurring from the electromigration of the global bit lines RGBL.

Under the looser criteria, the wiring width of the global bit lines RGBL can be reduced to minimize the layout area. As a result, the SRAM can be reduced in chip size with a reduction in chip cost.

Since the external power supply voltage VDD is used as the voltage for precharging the global bit lines RGBL, circuitry for generating the precharging voltage need not be formed in the SRAM. The SRAM can thus be reduced in chip size. Since the precharging circuits 30 and 32 are made of the pMOS transistors 30a and 32a, it is possible to minimize the layout sizes of the precharging circuits 30 and 32 and reduce the chip size of the SRAM.

The global bit lines RGBL are charged through the pMOS transistors 30a and 32a in precharge operations, and discharged through the nMOS transistors 24 in read operations. Consequently, the global bit lines RGBL can be surely changed to the power supply voltage VDD and the ground voltage VSS, so that data stored in the memory cells MC can be read at high speed.

Even when the complementary local bit lines /LBL and LBL are formed, the data of the memory cells MC can be read by connecting the global bit lines RGBL to the local bit lines /LBL alone. Since the global bit lines RGBL need not be formed in pairs, the SRAM can be prevented from increasing in chip size.

The global bit lines RGBL are laid along the direction of arrangement of the memory blocks BLK. The global bit lines RGBL are also laid in parallel with the local bit lines LBL and /LBL. This makes it possible to minimize the wiring length of the global bit lines RGBL with a reduction in wiring load. As a result, in precharge operations and read operations, the voltages of the global bit lines RGBL can be changed in a shorter time with a reduction in the access time of the SRAM. In addition, the layout design is facilitated.

Even in the SRAM where the global bit lines RGBL for read and the global bit lines WGBL, /WGBL for write are formed separately, it is possible to avoid a defect occurring from the electromigration of the global bit lines RGBL.

Figure 5:
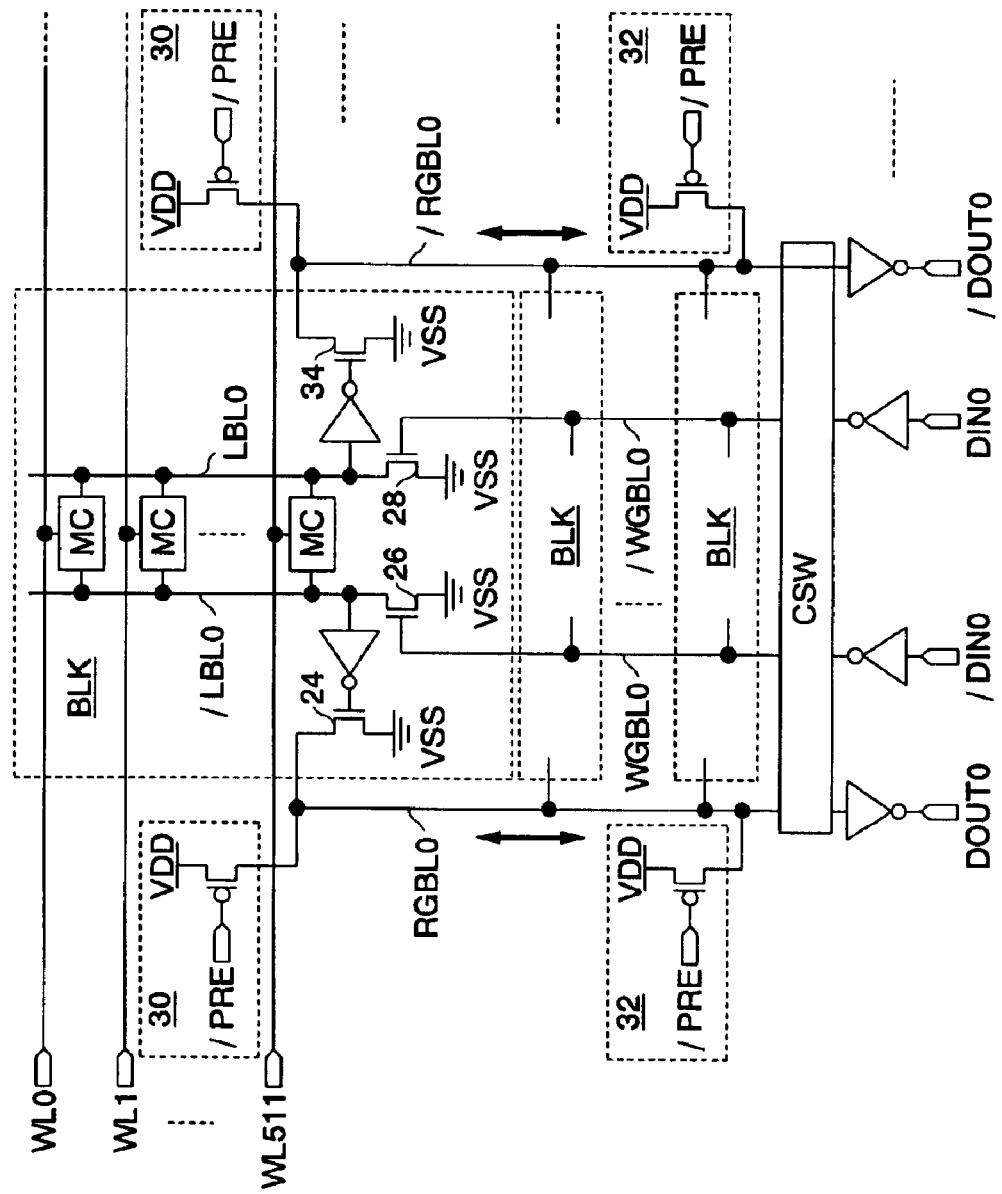
FIG. 5 is a block diagram showing the memory cell array according to a second embodiment of the semiconductor memory of the present invention.

FIG. 5 shows the memory cell array according to a second embodiment of the semiconductor memory of the present invention. The same elements as those described in the first embodiment will be designated by identical reference numbers or symbols. Detailed description thereof will be omitted here.

In this embodiment, a global bit line /RGBL0 (first global bit line) corresponding to the local bit lines LBL0 is laid along the direction of arrangement of the memory blocks BLK0. The global bit line /RGBL0 is also laid in parallel with the local bit lines LBL0 and /LBL0. Both ends of the global bit line /RGBL0, the top and bottom in the diagram, are connected to precharging circuits 30 and 32, respectively. The global bit line /RGBL0 is made of aluminum, copper, or such material. As for the not-shown other memory blocks BLK1–7, global bit lines /RGBL1–7 (not shown) are laid likewise.

The local bit line LBL0 is connected to the gate of an nMOS transistor 34 (second transistor) through a CMOS inverter. The source of the nMOS transistor 34 is connected to the ground line VSS (second power supply line) and the drain of the same is connected to the global bit line /RGBL0 through which read data is transferred. The local bit line LBL0, the global bit line /RGBL0, and the nMOS transistor 34 whose gate is connected to the local bit line LBL0 and whose drain is connected to the global bit line /RGBL0 constitute a hierarchical bit line structure of direct sense amplifier system. The nMOS transistor 34 functions as a sense amplifier (first amplifier) for amplifying the voltage of the local bit line LBL0.

The configuration of FIG. 5 is otherwise the same as in the first embodiment (FIG. 2). Besides, the overall configuration of the SRAM is the same as in the first embodiment (FIG. 1).

This embodiment can offer the same effects as those of the first embodiment described above.

The invention is not limited to the above embodiments and various modifications may be made without departing from the spirit and scope of the invention. Any improvement may be made in part or all of the components.

What is claimed is:

1. A semiconductor memory comprising:

a plurality of memory blocks each having a plurality of static memory cells, a first local bit line connected to said static memory cells, and a first amplifier having its input connected to the first local bit line to amplify voltage of said first local bit line;

a first global bit line connected commonly to outputs of said respective first amplifiers of said memory blocks to transfer read data amplified by said first amplifier of each of said memory blocks; and precharging circuits connected to both ends of said first global bit line, respectively, to precharge said first global bit line to a first power supply voltage.

2. The semiconductor memory according to claim 1, wherein said first power supply voltage is an external power supply voltage supplied from the exterior of the semiconductor memory.

3. The semiconductor memory according to claim 1, wherein said precharging circuits each have a first transistor whose gate receives a control signal being activated in a precharge operation, whose drain is connected to said first global bit line, and whose source is connected to a first power supply line for supplying said first power supply voltage.

4. The semiconductor memory according to claim 3, wherein:

said first amplifier has a second transistor whose gate receives the voltage of said first local bit line, whose drain is connected to said first global bit line, and whose source is connected to a second power supply line for supplying a second power supply voltage; and said first transistor of each of said precharging circuits and said second transistor of said first amplifier are inverse in polarity.

5. The semiconductor memory according to claim 1, wherein said first amplifier has a second transistor whose gate receives the voltage of said first local bit line, whose drain is connected to said first global bit line, and whose source is connected to a second power supply line for supplying a second power supply voltage.

6. The semiconductor memory according to claim 1, wherein said memory blocks each have a second local bit line connected to said static memory cells and not connected to each said first amplifier to transfer data complementary to the data transferred to said first local bit line.

7. The semiconductor memory according to claim 1, wherein said first global bit line is laid along the direction in which said memory blocks are arranged.

8. The semiconductor memory according to claim 1, further comprising a second global bit line for transferring write data to said static memory cells, and wherein said memory blocks each have a second amplifier having its input connected to the second global bit line to amplify voltage of said second global bit line and outputting the amplified data to said first local bit line.

9. The semiconductor memory according to claim 1, wherein said first global bit line is laid in parallel with said first local bit line.

* * * * *